(12) United States Patent
Terashi

(10) Patent No.: US 6,934,009 B2
(45) Date of Patent: Aug. 23, 2005

(54) ILLUMINATION APPARATUS, ILLUMINATION-CONTROLLING METHOD, EXPOSURE APPARATUS, DEVICE FABRICATING METHOD

(75) Inventor: Takaaki Terashi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 436 days.

(21) Appl. No.: 10/160,218

(22) Filed: May 30, 2002

(65) Prior Publication Data

US 2002/0196629 A1 Dec. 26, 2002

(30) Foreign Application Priority Data

May 31, 2001 (JP) ........................................ 2001-164734

(51) Int. Cl.⁷ .............................................. G03B 27/54
(52) U.S. Cl. .......................................... 355/67; 355/63
(58) Field of Search ............................ 362/268; 355/53, 355/67

(56) References Cited

U.S. PATENT DOCUMENTS

| | | | | |
|---|---|---|---|---|
| 5,644,390 A | * | 7/1997 | Yasuzato ..................... 356/121 |
| 6,049,374 A | | 4/2000 | Komatsuda et al. ........... 355/67 |
| 6,259,513 B1 | | 7/2001 | Gallatin et al. ............... 355/71 |
| 6,452,662 B2 | * | 9/2002 | Mulkens et al. .............. 355/67 |

FOREIGN PATENT DOCUMENTS

| | | |
|---|---|---|
| JP | 1-114035 | 5/1989 |
| JP | 9-160219 | 6/1997 |
| JP | 10-319321 | 12/1998 |
| WO | WO00/11706 | 3/2000 |

OTHER PUBLICATIONS

Notice of Reasons for Rejection (English Translation of Japanese Office Action) mailed Sep. 14, 2004.

* cited by examiner

Primary Examiner—Laura K. Tso
(74) Attorney, Agent, or Firm—Morgan & Finnegan, LLP

(57) ABSTRACT

There is provided an illumination apparatus including an optical integrator including multiple optical systems for receiving light from a light source, and for producing multiple beams for illuminating a plane of mask or reticle on which a pattern is draw, a position of an incidence plane of the optical integrator and a position of the plane to be illuminated being arranged optically conjugate with each other, and a device for forming an optical characteristic distribution of light at the incidence plane, the light entering at least part of the multiple optical systems, whereby different areas on the plane of plane to be illuminated can be illuminated under different illumination conditions.

6 Claims, 10 Drawing Sheets

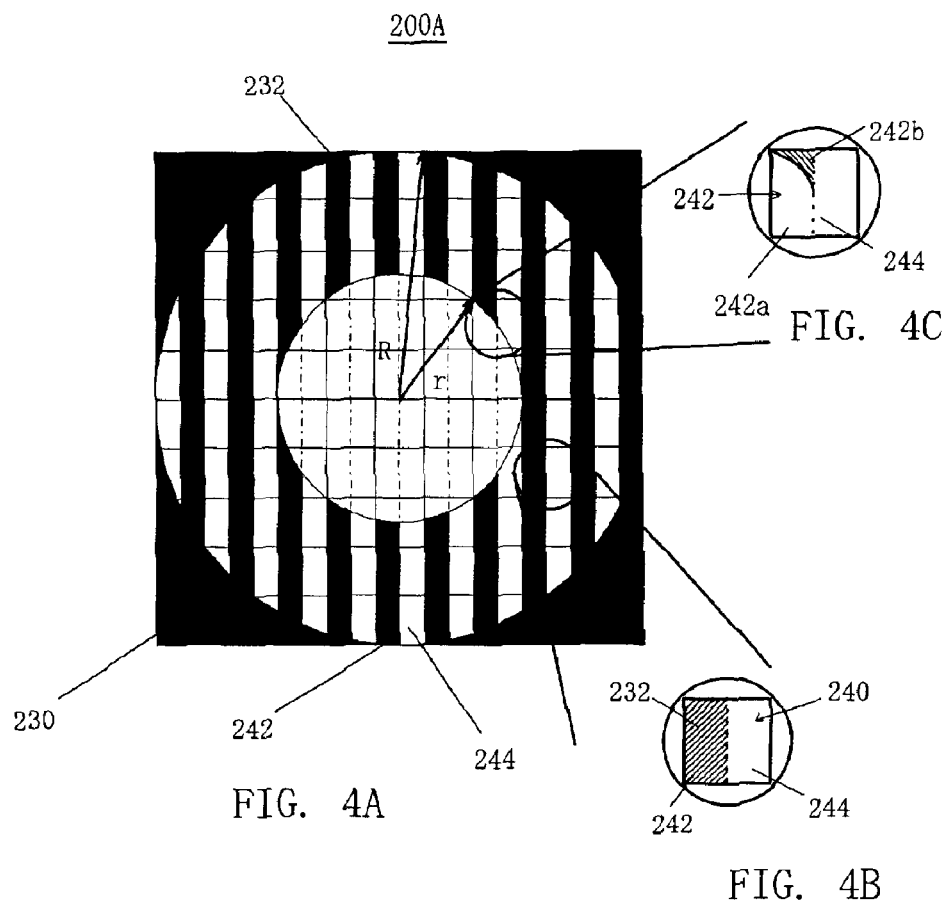
FIG. 4A
FIG. 4B
FIG. 4C
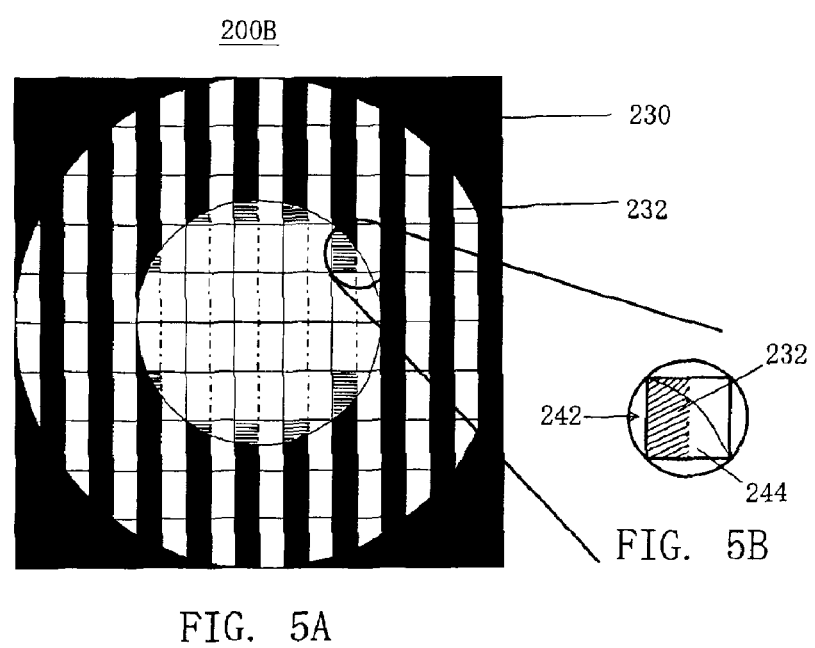
FIG. 5A
FIG. 5B

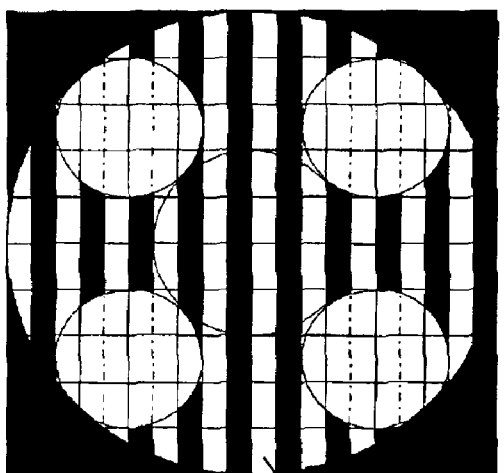
242  244  FIG. 12
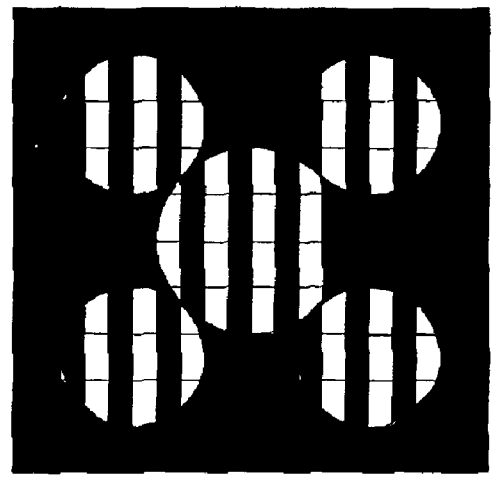
FIG. 14
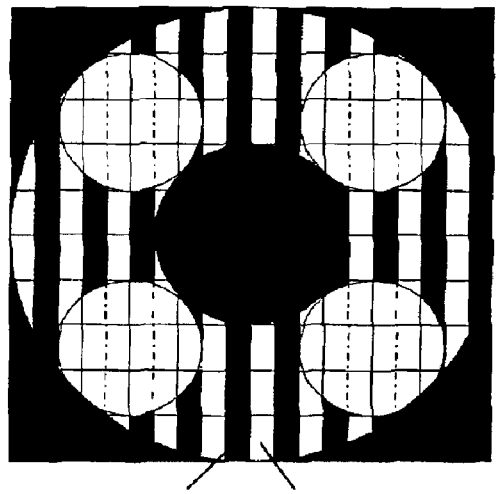
242  244
FIG. 13

ILLUMINATION APPARATUS, ILLUMINATION-CONTROLLING METHOD, EXPOSURE APPARATUS, DEVICE FABRICATING METHOD

BACKGROUND OF THE INVENTION

The present invention relates generally to illumination apparatuses, and more particularly to an illumination apparatus for illuminating a reticle or a mask (these terms are used interchangeably in the present application) on which a pattern is drawn, in an exposure apparatus for use with a photolithography process for fabricating semiconductor devices, liquid crystal display devices, image pick-up devices (CCD, and the like), thin-film magnetic heads, and the like.

Recent fine and highly integrated circuit patterns have required wafers with a critical dimension of 0.3 µm or less, and accordingly the lithography process has mainly used a projection exposure apparatus so as to meet this requirement. Generally, a projection exposure apparatus includes an illumination optical system for illuminating a mask, and a projection optical system, located between the mask and an object to be exposed, for projecting a pattern on the illuminated mask onto the object to be exposed. The illumination optical system introduces light from a light source to an optical integrator such as a fly-eye lens, and the like, and uses its exit plane as a secondary light source, thus Koehler-illuminates the plane of the mask via a condenser lens.

The circuit pattern may be classified into a line and space pattern as adjacent periodic linear patterns, a contact hole pattern as adjacent periodic hole-shaped patterns, and an isolated pattern that is not adjacent but is considered to be isolated. A pattern transfer with high resolution requires a selection of optimal exposure condition (such as an illumination condition and an exposure dose) in accordance with a kind of the pattern. The exposure condition includes, for example, an illumination condition and exposure amount, and the illumination condition includes the coherency σ. The coherency σ is the numerical aperture (NA) at the mask side of the illumination optical system as opposed to the NA at the mask side of the projection optical system, and the exposure optical system usually uses a partially coherent illumination of $0<\sigma<1$.

A phase shift mask with the relatively small σ with a phase shift mask, and a binary mask with modified illumination are suitable to the line and space pattern. The modified illumination is also called an off-axis illumination or oblique incidence illumination, and is a technique to turn an effective light source distribution into an annular or quadrupole shape, thus illuminating a mask using an obliquely incident beam. On the other hand, a half-tone or binary mask combined with a relatively large σ is suitable to the contact hole and isolated patterns.

A method has already been proposed which changes the coherency σ for the entire mask pattern according to mask patterns, for example, by making switchable a plurality of aperture stops, such as circular or annular aperture stop, which is usually provided just after the optical integrator in the illumination optical system.

The recent semiconductor industry has shifted its production from a memory chip, such as conventional DRAM, to a highly value-added system chip that integrates memory and logic patterns in a single chip. A memory pattern has a high pattern density and mainly a line and space pattern, and thus is congenial with a relatively small σ or an annular illumination. On the other hand, a logic pattern has a low pattern density and mainly an isolated pattern, and thus is congenial with an illumination with the relatively large σ. A fabrication of a system chip requires a blend of memory and logic patterns in a mask pattern.

However, the conventional configuration cannot partially modify the illumination condition for the mask plane. As a consequence, the mask having two kinds of patterns should be illuminated under a single illumination condition congenial with only one of these patterns, and thus the optimal lithography process and desired resolution have been hard to be obtained

BRIEF SUMMARY OF THE INVENTION

It is an exemplary object of the present invention to provide an illumination apparatus as well as an illumination-controlling method, an exposure apparatus, a device fabrication method, which may provide a high quality exposure to a mask which draws multiple kinds of patterns each requiring a different optimal illumination condition.

An illumination apparatus as one aspect of the present invention includes an optical integrator including multiple optical systems for receiving light from a light source, and for producing multiple beams for illuminating a plane to be illuminated, a position of an incidence plane of the optical integrator and a position of the plane of to be illuminated being arranged optically conjugate with each other, and a device for forming an optical characteristic distribution of light at the incidence plane, the light entering at least part of the multiple optical systems, whereby the different areas on the plane to be illuminated may be illuminated under different illumination conditions. This illumination apparatus illuminates different areas under different illumination conditions (e.g., a shape and/or size of an effective light source formed at an exit plane of the optical integrator, polarization, illuminance, phase, etc.). For example, this may provide illumination light having a small effective light source for a line and space pattern in one area of the mask, and that having a large effective light source for an isolated pattern on another area.

An exposure apparatus as another aspect of the present invention includes the above illumination apparatus for illuminating a mask or reticle on which a pattern is formed, and a projection optical system for projecting the pattern onto an object. Such a projection exposure apparatus exhibits the same operations as the above illumination apparatus.

The illumination and exposure apparatuses may include a light shielding pattern for forming a light intensity distribution as the optical characteristic distribution, a polarization pattern for forming a polarization distribution as the optical characteristic distribution, a light attenuating pattern for forming a light intensity distribution as the optical characteristic distribution, a phase shift pattern for forming a phase distribution as the optical characteristic distribution, etc., thus providing the variable optical characteristic distribution. The illumination and the exposure apparatuses may include multiple illumination-controlling members for making the distribution of the optical characteristic distribution variable, and a control unit for selecting a member from among the illumination-controlling members according to the pattern on the mask or reticle. Such a control unit selects an optimal illumination-controlling member according to different areas of the mask pattern. The illumination and exposure apparatuses may include an optical integrator for uniformizing illumination light used to illuminate the mask, and the illumination-controlling member is located at or near the incidence plane of the optical integrator.

A device fabricating method as still another aspect of the present invention includes the steps of exposing a device pattern to an object by using the above illumination or projection exposure apparatus, and performing a predetermined process for the exposed object. The device fabricating method that exhibits operations similar to those of the above illumination and exposure apparatuses covers devices as their intermediate products and finished products. Moreover, such devices include, e.g., semiconductor chips such as system LSIs, CCDs, LCDs, magnetic sensors, thin-film magnetic heads, etc.

An illumination-controlling method as still another aspect of the present invention includes the steps of selecting a desired illumination-controlling member from among multiple illumination-controlling members for illuminating a mask or reticle that includes multiple pattern areas each of which has a different kind of pattern that requires a different illumination condition, each illumination-controlling member having multiple illuminating areas on the same plane for illuminating the mask or reticle under a different illumination condition for each pattern area, the illuminating area of the desired illumination-controlling member providing illumination conditions most suitable to the pattern areas from among the multiple illumination-controlling members, and illuminating the mask or reticle using the desired illumination-controlling member. Such a method also calculates and selects an illumination-controlling member having an illuminated area that provides an optimal illumination condition to each pattern when the mask includes multiple kinds of patterns, thus illuminating the mask with high quality via the illumination-controlling member.

Other objects and further features of the present invention will become readily apparent from the following description of the embodiments with reference to accompanying drawings.

BRIEF DESCRIPTION OF THE DRAWINGS

FIG. 3A is a schematic plan view of an illumination-controlling member having a circular aperture. FIG. 3B is a partially enlarged plan view of the illumination-controlling member shown in FIG. 3A.

FIG. 4A is a schematic plan view of an example applicable to the illumination-controlling member shown in FIG. 1. FIG. 4B is a partially enlarged plan view of FIG. 4A. FIG. 4C is a partially enlarged plan view of another part of the illumination-controlling member shown in FIG. 4A.

FIG. 5A is a schematic plan view of a variation of the illumination-controlling member shown in FIG. 4A. FIG. 5B is a partially enlarged plan view of FIG. 5A.

FIG. 12 is still another example applicable to the illumination-controlling member shown in FIG. 1.

FIG. 13 is still another example applicable to the illumination-controlling member shown in FIG. 1.

FIG. 14 is still another example applicable to the illumination-controlling member shown in FIG. 1.

FIG. 16A is a plane view of an annular aperture stop. FIG. 16B is a plane view of a quadrupole aperture stop.

DETAILED DESCRIPTION OF THE PREFERRED EMBODIMENTS

Figure 1:
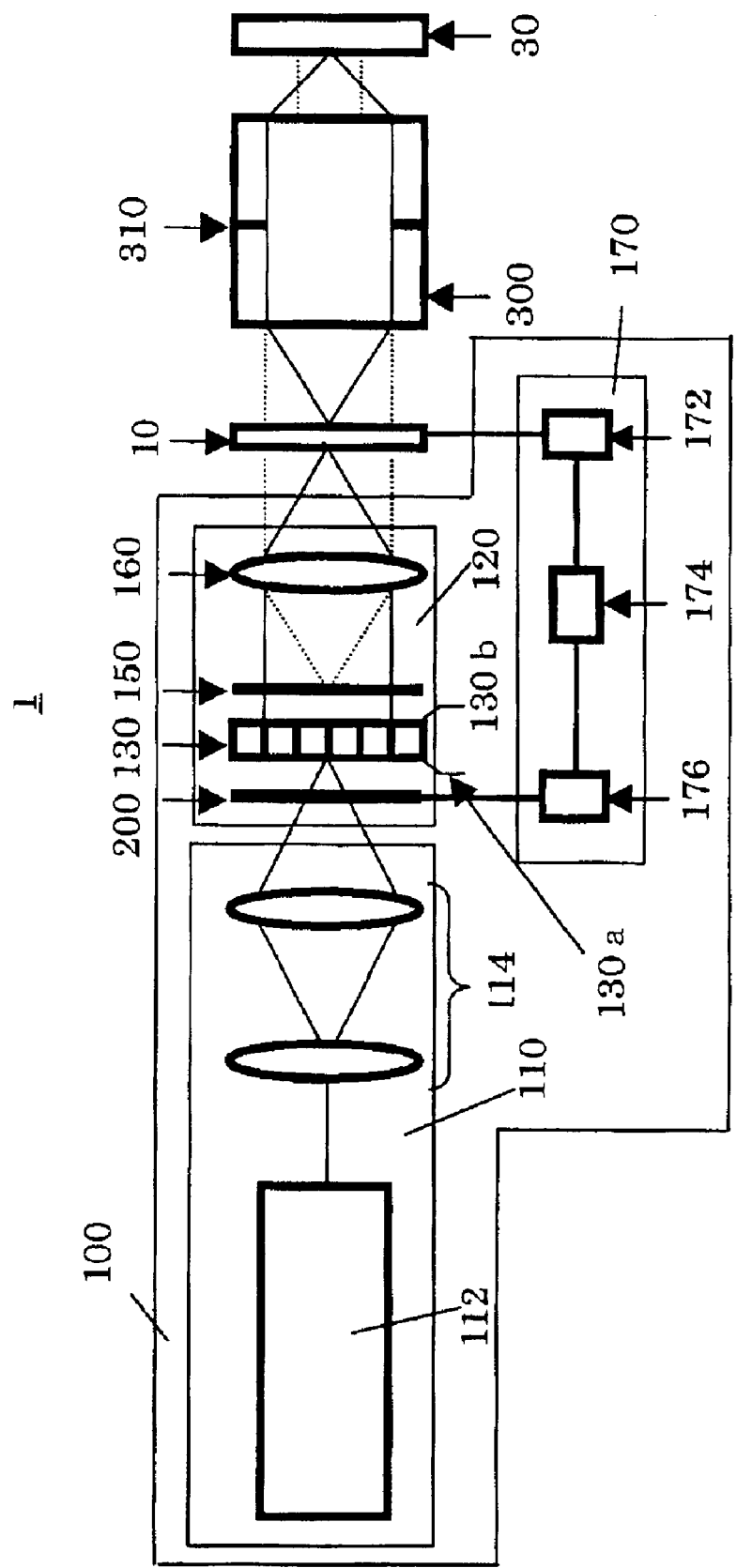
FIG. 1 is a schematic sectional view of an exposure apparatus as one aspect of the present invention.

A description will now be given of an exposure apparatus 1 as one aspect of the present invention with reference to accompanying drawings. Here, FIG. 1 is a schematic sectional view of an exposure apparatus 1 of the present invention. As shown in FIG. 1, the exposure apparatus 1 includes a mask 10 on which a circuit pattern to be transferred is created, a plate 30, an illumination apparatus 100 that illuminates the mask 10, and a projection optical system 300. The exposure apparatus 1 of the present invention is especially effective when the plate 30 is a wafer that is used to fabricate a system chip in which a memory pattern and a logic pattern is mixed in one chip. However, the exposure apparatus 1 of the present invention does not preclude its application for an exposure process to fabricate memory chips.

The exposure apparatus 1 is a projection exposure apparatus that exposes onto the plate 30 the circuit pattern created on the mask 10, for example, in a step-and-repeat manner and step-and-scan manner. This projection exposure apparatus is suitable for a lithography process of a submicron or a quarter-micron or less, and thus a description will be given of a step-and-scan type exposure apparatus (also called as a "stepper") as an example in this embodiment. Here, the "step-and-repeat manner" is one mode of exposure method that moves a wafer stepwise to an exposure area for the next shot every shot of cell projection onto the wafer. The "step-and-scan manner," is another mode of exposure method that exposes a mask pattern onto a wafer by continuously scanning the wafer relative to the mask, and by moving, after a shot of exposure, the wafer stepwise to the next exposure area to be shot.

The mask 10 is made, for example, of quartz, on which the circuit pattern (or image) to be transferred is created, and is supported by a first stage not shown (called a reticle stage). Diffracted light emitted from the mask 10 is projected onto the plate 30 through the projection optical system 300. In the instant embodiment, the plate 30 is a wafer used to fabricate a system chip, and the mask 10 also mixes multiple kinds of circuit patterns.

Figure 2:
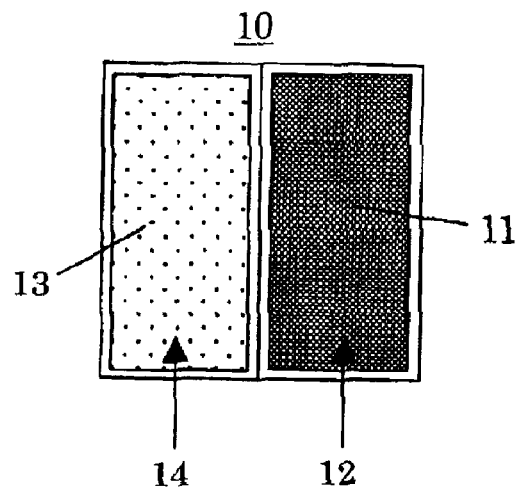
FIG. 2 is a schematic plan view of the mask of the exposure apparatus shown in FIG. 1.

FIG. 2 shows a schematic plan view of the mask 10. As illustrated, the mask 10 is comprised of a right pattern area 12 where a memory pattern 11 is created, and a left pattern area 14 where a logic pattern 13 is created. The memory pattern 11 has a high pattern density, and is mainly comprised of a line and space pattern and therefore congenial with relatively small coherency σ or annular illumination. On the other hand, the logic pattern 13 has a low pattern density, and is comprised mainly of an isolated pattern and therefore congenial with illumination with relatively large coherency σ. In this way, the mask 10 in the instant embodiment includes multiple kinds of pattern areas 12 and 14 that require different illumination conditions.

The plate 30 is an object to be exposed such as a wafer and a liquid crystal plate. Photoresist is applied onto the plate 30. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The plate 30 is supported by a second stage (sometimes called a "wafer stage"). The second stage may use any structure known in the art, and thus a detailed description of its structure and operation will be omitted. For example, the second stage uses a linear motor to move the plate 30 in X-Y directions. The mask 10 and plate 30 are, for example, scanned synchronously, and the positions of the first and second stages are monitored, for example, by a laser interferometer and the like, so that both are driven at a constant speed ratio. The second stage is installed on a stage surface plate supported on the floor and the like, for example, via a damper, and the first stage and the projection optical system 300 are installed on a body tube stool (not shown) supported, for example, via a damper to the base-frame placed on the floor.

The illumination apparatus 100 illuminates the mask 10 on which the circuit patterns 11 and 13 to be transferred are created, and includes a light source section 110, an illumination optical system 120, and an illumination controller 170 that controls the illumination-controlling member 200 (which will be described later) of the illumination optical system 120.

The light source section 110 includes a laser 112 as a light source and a beam shaping system 114.

The laser 112 may use an ArF excimer laser with a wavelength of approximately 193 nm, a KrF excimer laser with a wavelength of 248, an F$_2$ excimer laser with a wavelength of 157 nm, etc. However, a kind of laser is not limited to the excimer laser. For example, a YAG laser can be used, and the number of laser units is not limited. For example, if two units of solid laser that operates independently are used, no coherence between these solid laser units exists, and thus speckles arising from the coherence will be reduced considerably. Further, in order to reduce speckles, it would be advisable to swing an optical system in a straight or rotary manner. Moreover, a light source applicable to the light source section 110 is not limited to the laser 112, but may use one or more lamps such as a mercury lamp, xenon lamp, etc.

The beam shaping system 114 can use, for example, a beam expander, etc., with a plurality of cylindrical lenses, and convert the aspect ratio of the size of the sectional shape of the parallel beams from the laser 112 into desired values (for example, change the sectional shape from a rectangle to a square), thus reshaping the beam shape to a desired one. The beam shaping system 114 forms a beam that has a size and angle of divergence necessary for illuminating a fly-eye lens, which will be described later.

It would be advisable for the light source section 110 to use an incoherently turning optical system, although it is not shown in FIG. 1, for turning a coherent laser beam into an incoherent one. The incoherently turning optical system may use an optical system that includes at least one return system that, for example, as disclosed in FIG. 1 of Japanese Laid-Open Patent Application No.3-215930, splits an incident beam on a light splitting plane at least into two beams (e.g., p polarized light and s polarized light). The return system then provides one of them, relative to the other beam, with an optical path length difference more than the coherence length of a laser beam via an optical member, and subsequently feeds it back to the splitting plane so that the superimposed light is emitted.

The illumination optical system 120 is an optical system for illuminating the mask 10, and includes an illumination-controlling member 200, an optical integrator 130, an aperture stop 150, and a condenser lens 160 in the embodiment. The laser 112, the incidence plane 130a of the optical integrator 130, the mask 10 and the wafer 30 are maintained in an optically conjugate relationship. The aperture stop 150 and the pupil plane 310 of the projection optical system 300 are maintained in an optically conjugate relationship.

The illumination-controlling member 200 is located near the incidence plane 130a of the optical integrator 130, and controls illumination light so as to illuminate multiple areas 12 and 14 on the mask with different illumination conditions optimal to expose the patterns 11 and 13. The illumination conditions include, e.g., coherency σ, polarization, illuminance, and/or a shape of the effective light source as a shape of the illumination light at a position optically conjugate with the mask 10.

A description will now be given where the illumination-controlling member 200 of the present embodiment illuminates the area 12 having the memory pattern 11 by small coherency σ, and the area 14 having the logic pattern 13 by large coherency σ.

Figures 3A, 3B:
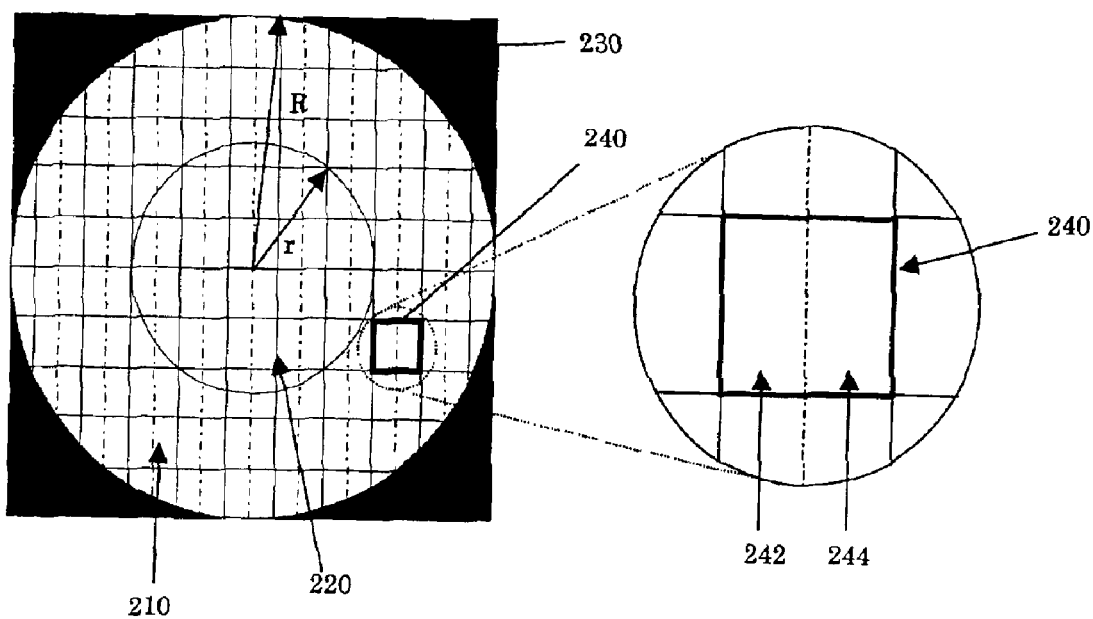
FIGS. 3A and 3B are views for explaining a relationship between the areas of illumination-controlling members of the exposure apparatus shown in FIG. 1.

Referring to FIG. 3, a description will be given of a relationship between the illuminating area on the illumination-controlling member 200 and the pattern areas 12 and 14 on the mask 10. Here, FIG. 3A is a plan view viewed from the incidence plane when the illumination-controlling member 200 uses a circular aperture. The illumination-controlling member 200 is divided into multiple areas 240 surrounded by thick solid lines (called cells hereinafter). FIG. 3B is an enlarged plan view of a cell 240 in the illumination-controlling member 200 shown in FIG. 3A. Each cell 240 is divided into left and right illumination areas 242 and 244.

Referring to FIG. 3A, the illumination-controlling member 200 comprises an aperture area 210 having large coherency σ as a circle with a radius of R, an aperture area 220 of small coherency σ as a circle with a radius of r, and a light shielding part 230. The coherency σ is the numerical aperture (NA) at the side of the mask 10 of the illumination optical system 100 as opposed to the NA at the side of the mask 10 of the projection optical system 300. The NA at the side of the mask 10 of the projection optical system 300 is fixed in this embodiment, and since the NA at the side of the mask 10 of the illumination optical system 100 is proportional to the radius of the aperture shown in FIG. 3A, the coherency σ is proportional to the radius of the aperture (such as R and r) shown in FIG. 3A. In this embodiment, if the radius is greater than r and equal to R, the coherency σ is regarded to be large, and if the radius is equal to or smaller than r, the coherency a is regarded to be small. In FIG. 3A, r=R/2. Since the projection exposure apparatus 1 uses partial coherency illumination, R=1 may be used. Since r=R/2, in this embodiment, the coherency is large where exemplarily 0.5<σ<1, and the coherency is small where 0<σ<0.5.

Each cell 240 corresponds to each fine lens in a fly-eye lens as an optical integrator 130, which will be described later. Therefore, it is possible to change the size of a cell 240 by adjusting the size of a fine lens in the fly-eye lens. Since the illumination-controlling member 200 is maintained in a relationship optically approximately conjugate with the mask 10, the left illuminating area 242 corresponds to the right pattern area 12 while the right illuminating area 244 corresponds to the left pattern area 14. The areas 12 and 14 on the mask 10 shown in FIG. 2 and the areas 242 and 244 shown in FIG. 3B are reversed because the condenser lens described later forms an inverted image. When the condenser lens can form an erect image, the corresponding parts in the illumination-controlling member 200 are accordingly reversed.

It is thus understood that when the left area 242 is illuminated with small coherency σ and the right area 244 is illuminated with large coherency σ, the areas 12 and 14 on the mask 10 can be optimally illuminated. All the areas 242 and 244 in FIG. 3A cover a circle with a radius of R without being shielded from light, and thus the illumination-controlling member shown in FIG. 3A illuminates both the illuminating areas 242 and 244 both with the large coherency σ. Since the illumination-controlling member shown in FIG. 3A illuminates the areas 12 and 14 with the same large coherency σ, it is inappropriate, in view of the coherency, to apply it to the illumination-controlling member 200 shown in FIG. 1. The illumination-controlling member 200 in this embodiment must illuminate the areas 12 and 14 on the mask 10 with different illumination conditions. The illumination-controlling member shown in FIG. 3 is applicable when an adjustment of the illumination condition, such as an illuminance adjustment as described later, is made on the illuminating areas 242 and 244.

FIGS. 4 and 5 show exemplary illumination-controlling members 200A and 200B for illuminating the left area 242 with small coherency σ and the right area 244 with large coherency σ. Here, FIG. 4A is a schematic plan view when an illumination-controlling member 200A applicable to the illumination-controlling member 200 shown in FIG. 1 is viewed from the incidence plane, and FIGS. 4B and 4C are their partially enlarged plan views. FIG. 5A is a schematic plan view of an illumination-controlling member 200B as another example applicable to the illumination-controlling member 200 shown in FIG. 1, and FIG. 5B is its partially enlarged plan view. In the examples shown in FIGS. 4 and 5, the illumination-controlling member 200 changes the coherency σ of the illumination light irradiated onto the pattern areas 12 and 14 on the mask, using a shape of the effective light source (i.e., as a shape appearing in the plane of pupil of the projection optical system 300). In other words, the illumination-controlling members shown in FIGS. 4 and 5 are examples for changing a shape of an effective light source for the pattern areas 12 and 14.

Referring to FIGS. 4A and 4B, the illumination-controlling member 200A differs from the illumination-controlling member shown in FIG. 3 in that the left area 242 of the cell 240 is shielded from light by the light shielding part 232 in the annular part with a radius from r to R. On the other hand, the right area 244 of the cell 240 is open in the range of a circle with the radius of R. As a result, the area 242 is open only in the range of the circle with the radius of r, thus bringing about illumination of small coherency σ, while the area 244 is open in the range of the circle with the radius of R, bringing about illumination of large coherency σ. From the above, it is understood that the areas 12 and 14 on the mask 10 are optimally illuminated. In view of the shape of the effective light source, FIGS. 4A and 4B illuminate the area 12 by a circular effective light source with a small radius, and the area 14 by a circular effective light source with a large radius.

Since the boundary line that defines the circle with a radius of r intersects the light shielding part 232 in FIG. 4A, there is an area 242 mixing an aperture 242a and a light shielding part 242b, as shown in FIG. 4C. Undesirably, this area illuminates the memory pattern 11 on the mask 10 while partially shielding it from light.

As shown in FIGS. 5A and 5B, the area 242a in FIG. 4C may be covered by the light shielding part 232. Alternatively, the shielded part (not shown) of the area 242b shown in FIG. 4C may be changed into an aperture. Strictly speaking, in the illumination-controlling member 200B shown in FIG. 5, the coherency of the illuminating area on the boundary line of the radius r somewhat deviates from the "large" or "small" range as defined above but within a permissible range according to the instant embodiment. A smaller illuminating area is available which crosses the boundary line of the radius r as shown in FIG. 5, when the size of a fine lens in the fly-eye lens as the optical integrator 130 may be reduced as mentioned above.

FIG. 5B shows an illuminating area that intersects the circle with the radius of r, but it is understood that the same also applies to the illuminating area that intersects the circle with the radius of R. It is, however, important in this case that there is no vignette for the optical integrator 130.

In view of the shape of the effective light source, FIG. 5A and 5B are regarded to illuminate the area 12 by a circular effective light source with a large radius, and the area 14 by a circular effective light source with a small radius and irregular edges.

Thus, the inventive illumination-controlling member 200 may illuminate the area 12 having the memory pattern 11 with the small coherency σ, and the area 14 having the logic pattern 13 with the large coherency σ, thus being able to illuminate the mask 10 mixed with different kinds of patterns with an optimum condition for each area. Further, the present invention exposes different patterns 12 and 14 on the mask 10 at the same time not through double exposure, but through a single exposure using an illumination-controlling member 200, and therefore the structure of the exposure apparatus becomes simple and the overlay precision and throughput are higher compared to the double exposure.

Figure 8:
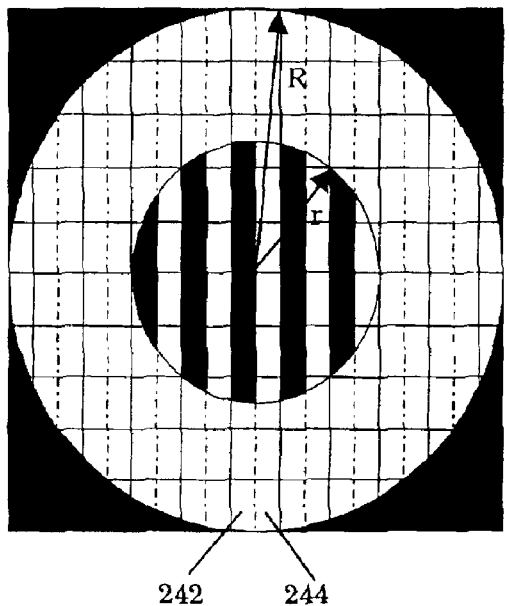
FIG. 8 is a schematic plan view of another example applicable to the illumination-controlling member shown in FIG. 1.
Figure 9:
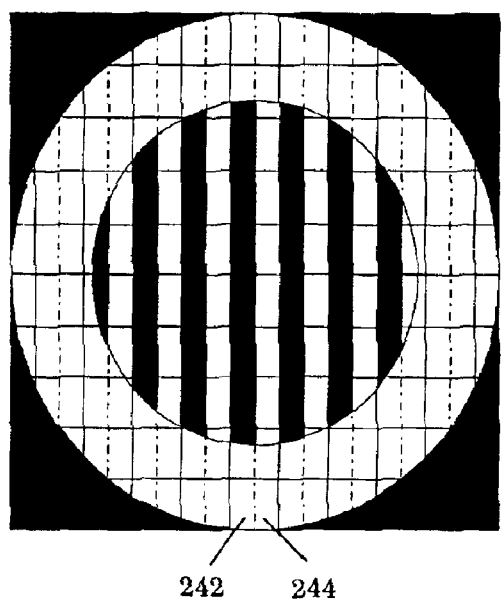
FIG. 9 is still another example applicable to the illumination-controlling member shown in FIG. 1.
Figure 10:
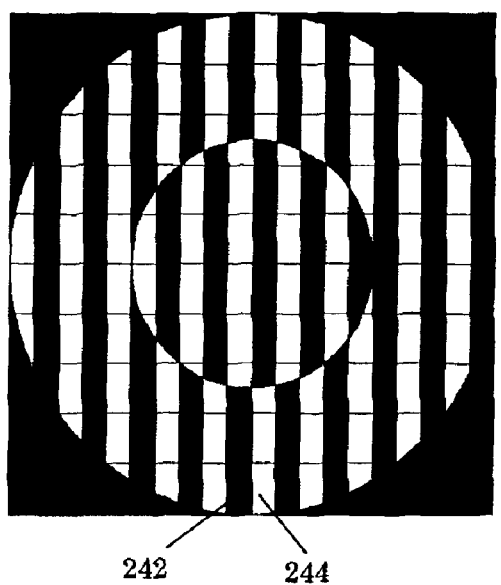
FIG. 10 is still another example applicable to the illumination-controlling member shown in FIG. 1.
Figure 11:
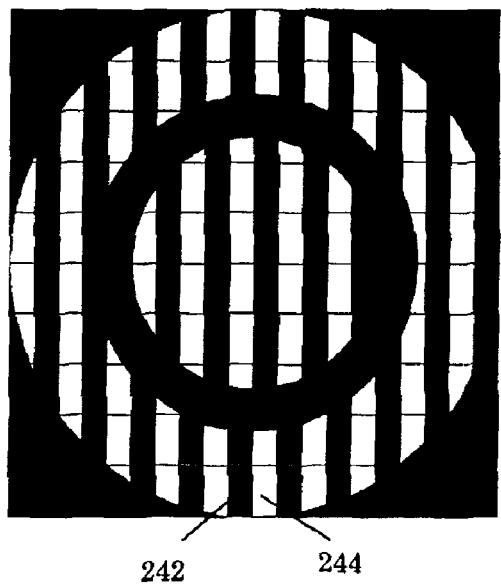
FIG. 11 is still another example applicable to the illumination-controlling member shown in FIG. 1.

While changing its pattern, the illumination-controlling member 200 can illuminate the mask 10 mixed with various different patterns using different coherency or an effective light source for each area. For example, FIG. 8 is a schematic plan view at the side of the incidence plane of an illumination-controlling member 200D that brings about annular illumination with the area 242 having the large coherency σ and a radius of r (=R/2) up to R, and circular illumination with the area 244 having the large coherency σ with a radius of R. FIG. 9 is a schematic plan view at the side of the incidence plane of an illumination-controlling member 200E that brings about annular illumination with the area 242 having the large coherency σ and a radius of r (=2R/3) up to R, and circular illumination with the area 244 having the large coherency σ with a radius of R. FIG. 10 is a schematic plan view at the side of the incidence plane of an illumination-controlling member 200F that brings about circular illumination with the area 242 having the small coherency σ and a radius of r, and annular illumination with the area 244 having the large coherency σ with a radius of r (=R/2) up to R. FIG. 11 is a schematic plan view at the side of the incidence plane of an illumination-controlling member 200G that brings about circular illumination with the area 242 having the small coherency σ and a radius of r, and annular illumination with the area 244 having the large coherency σ with a radius of r (=2R/3) up to R. FIG. 12 is a schematic plan view at the side of the incidence plane of an illumination-controlling member 200H that brings about circular illumination with the area 242 having quadrupole illumination, and the area 244 having the large coherency σ with a radius of R. FIG. 13 is a schematic plan view at the side of the incidence plane of an illumination-controlling member 200I that brings about annular illumination with the area 242 having quadrupole illumination, and the area 244 having the large coherency σ with a radius of r (=R/2) up to R. FIG. 14 is a schematic plan view at the side of the incidence plane of an illumination-controlling member 200J that brings about circular illumination with the area 242 having quadrupole illumination, and the area 244 having the small coherency σ.

The illumination-controlling member 200 may also illuminate the areas 12 and 14 on the mask 10 using different illuminance. In this case, the illumination-controlling member 200 adjusts a light volume that transmits at least one fine lens among the multiple minute lenses in the fly-eye lens as the optical integrator 130, which will be described later. The light volume is adjusted, for example, by using a neutral density (ND) filter for an opening section or light transmitting part in each cell 240 on the illumination-controlling member 200, which filter adjusts a light volume (or lowers light) without affecting the color. The ND filter (not shown) and the light shielding parts 232 and 233 are formed through a vapor disposition of a metal film such as chromium (Cr) or a dielectric multilayer film onto a glass plate so as to obtain desired transmittance. The ND filter may use a reflecting filter that applies an absorbent glass filter and metal coating. A metal-coated filter is neutral, and an absorbent glass may be used in combination with it. Any other member exhibiting an optically similar attribute to an ND filter can be used. For example, use of a liquid crystal display element would be able to control a specific partial area in each cell 240 to desired transmittance.

Figure 6:
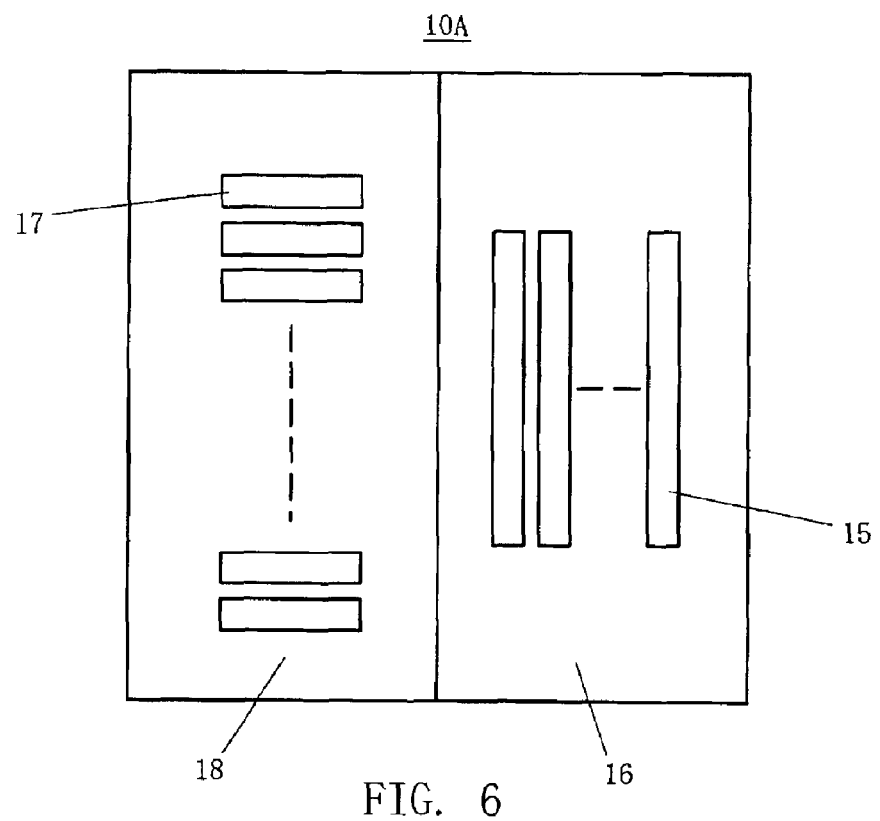
FIG. 6 is a schematic plan view of a variation of the mask shown in FIG. 2.
Figure 7:
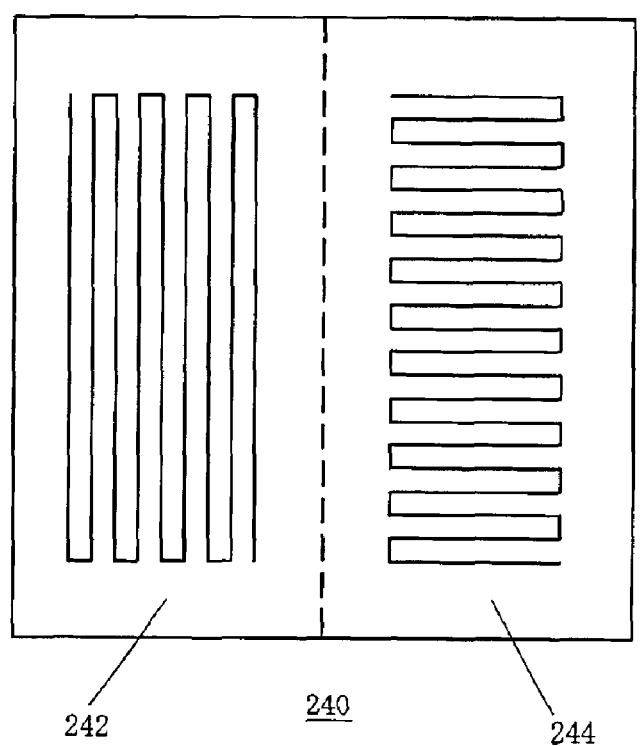
FIG. 7 is a partially enlarged plan view of the illumination-controlling member corresponding to the mask shown in FIG. 6.

The illumination-controlling member 200 may also illuminate the areas 12 and 14 of the mask 10 with different polarizations. In particular, when the critical dimension in a line-and-space pattern is 1 μm or less, or when a periodic pattern is of submicron and the NA of the exposure apparatus 1 is large, the improved resolution is available by making the optical vibrating direction accord with a longitudinal direction of the pattern. As shown in FIG. 6, for example, in exposing a mask 10A that includes an area 16 including longitudinally arranged circuit patterns 15 and an area 18 including the laterally arranged circuit patterns 17, it is appropriate to control the polarization as shown in FIG. 7 so that light vibrating in a longitudinal direction (p-polarization) transmits the area 242 and light vibrating in a lateral direction (s-polarization) transmits the area 244 for each cell The optical integrator 130 uniformizes illumination light for illuminating the mask 10, and includes a fly-eye lens in this embodiment, which converts an angular distribution of incident light to a positional distribution on exiting the light. The fly-eye lens is so maintained that its incidence plane 130a and its exit plane 130b are in the relationship of an object plane and pupil plane (or a pupil plane and image plane). Such a relationship is sometimes called a Fourier transformation relationship in this application. Nevertheless, as described later, the optical integrator 130 applicable to the present invention is not limited to the fly-eye lens.

The fly-eye lens arranges a plurality of lenses (lens elements) at both sides, the other side of which has a different focus. When a sectional shape of each lens element in the fly-eye lens is approximately similar to the illuminated area by the illumination apparatus if each lens element has a spherical lens surface, the fly-eye lens has high light utilization efficiency for illumination light. This is because the incidence plane and the illuminating area are in the relationship of a pupil and an image (i.e., a conjugate relationship).

Although this embodiment makes the fly-eye lens of many lens elements each having a square section because the cell 240 is square, as shown in FIG. 3, the present invention does not exclude those lenses having a circular, rectangular, or hexagonal section or any other shapes. The condenser lens 160 superimposes, onto the mask 10, beams from multiple point-light sources (effective light sources) at or around the exit plane 130b of the fly-eye lens. Thus, the entire mask 10 will be uniformly illuminated by multiple point-light sources (effective light sources).

Figure 15:
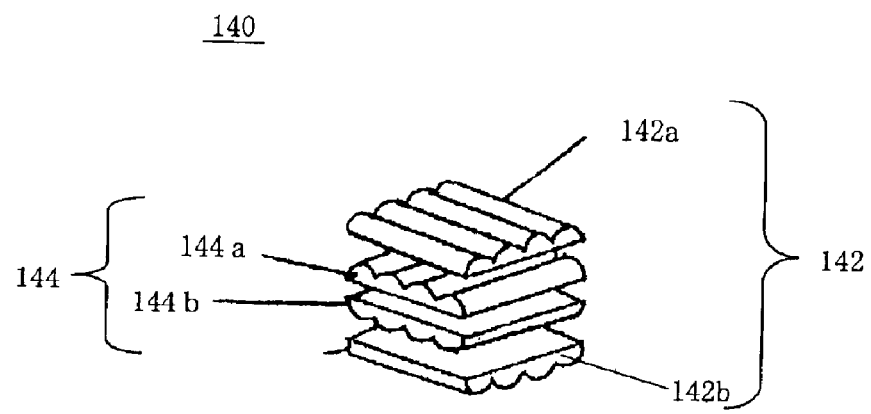
FIG. 15 is a partial perspective view of an integrator applicable to the optical integrator of the exposure apparatus shown in FIG. 1.

The optical integrator 130 applicable to the present invention is not limited to a fly-eye lens. It may be replaced, for example, with an optical integrator 140 shown in FIG. 15. Here, FIG. 15 is an enlarged perspective view of the optical integrator 140. The optical integrator 140 is made of stacked two sets of cylindrical lens array plates 142 and 144 (or lenticular lenses). The cylindrical lens array plates 142a and 142b as a pair of first and fourth plates have a focal distance f1, while the cylindrical lens array plates 144a and 144b as a pair of second and third plates have a focal distance of f2 different from f1. The cylindrical lens array plate in the same set is disposed at the focal position of its partner. These two sets of the cylindrical lens array plates 142 and 144 are arranged at right angle, and create different beams with an F number (namely, a lens' focal distance/effective aperture) in an orthogonal direction. Of course, the number of sets of the optical integrator 140 is not limited to 2.

The fly-eye lens 130 may be replaced with an optical rod. The optical rod uniformizes an illumination distribution at the exit plane, which has not been uniform at the incidence plane, and has a rectangular section wherein a sectional shape perpendicular to a rod axis has an approximately same aspect ratio as the illuminated area. If the optical rod has power with respect to the sectional shape perpendicular to the rod axis, the intensity of illumination at the exit plane does not become uniform, and thus the sectional shape perpendicular to the rod axis is a polygon formed only by straight lines. The fly-eye lens 130 may be replaced with a diffractive element exhibiting a diffusive behavior.

An aperture stop 150 is provided just after the exit plane 134 of the fly-lens 130, and has a fixed shape and diameter. The aperture stop 150 has, for example, a circular aperture.

Figures 16A, 16B:
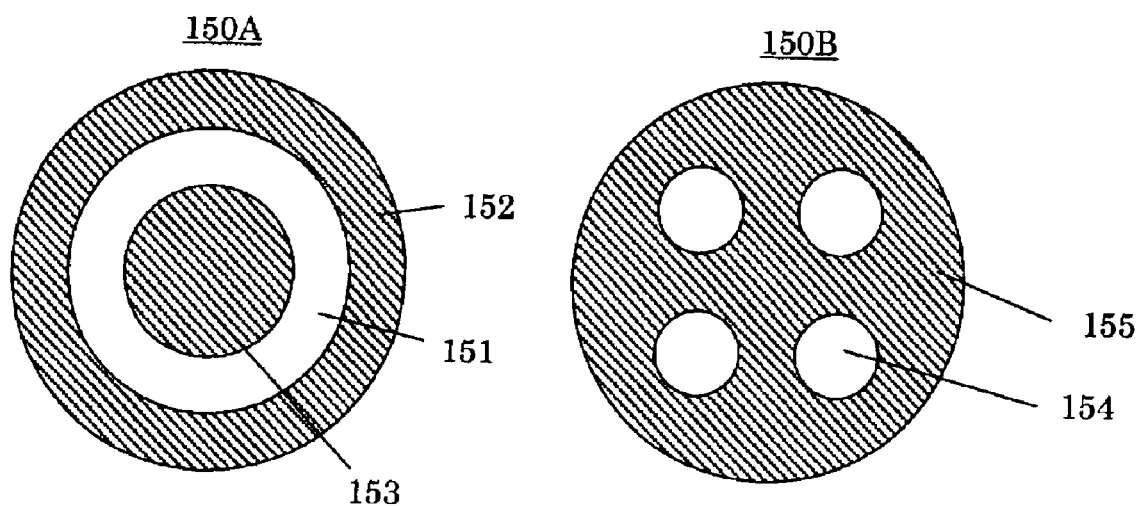
FIGS. 16A and 16B are schematic plan views when the aperture stop shown in FIG. 1 is adapted as an aperture stop for modified illumination.

Optionally, the aperture stop 150 may be, for example, an annular aperture stop 150A that includes an annular light transmitting part 151 and light shielding parts 152 and 153 as shown in FIG. 16A. Here, FIG. 16A is a plan view of the aperture stop 150A usable for the aperture stop 150. Alternatively, as shown in FIG. 16B, the aperture stop 150 may be an aperture stop 150B that includes a light transmitting part 154 and light shielding part 155. Here, FIG. 16B is a plan view of a quadrupole aperture stop 150B usable for the aperture stop 150. The light transmitting part 154 corresponds to ±45° and ±135° parts of the light transmitting part 155. The aperture stops 150A and 150B are effective as modified illumination (oblique incidence illumination) that increases the depth of focus around the resolution limit when it exposes a pattern on the mask 10.

The condenser lens 160 condenses as many rays of light emitted from the fly-eye lens 130 as possible, and Koehler-illuminates the mask 10 so that the chief rays may become parallel, i.e., telecentric. The mask 10 and the exit plane 130b of the fly-eye lens 130 are arranged in the Fourier transformation relationship.

The exposure apparatus 1 may have, if needed, a width-variable slit for controlling uneven illumination or a masking blade (a stop or a slit) for regulating the exposure area during a scan. The masking blade, if any, and the exit plane 130b of the fly-eye lens 130 are arranged in the Fourier transformation relationship. Beams that have transmitted an opening section of the masking blade are used as the illumination light for the mask 10.

The illumination controller 170 includes a detecting section 172, an arithmetic section 174, and a drive section 176. The detecting section 172 is connected to the mask 10 and the arithmetic section 174, and reads the kind of patterns 11 and 13 on the mask 10. For example, the detecting section 172 reads an identifier or a bar code recorded in advance that identifies the circuit pattern 11 or 13. Read-out data of the patterns 11 and 13 on the mask 10 is sent to the arithmetic section 174. The arithmetic section 174 is connected to the detecting section 172 and the drive section 176, and based on the data from the detecting section 172, calculates an illumination condition optimal for each area 12 or 14, thus sending it to the drive section 176. The drive section 176 is connected to the arithmetic section 176 and the illumination-controlling member 200, thus driving the illumination-controlling member 200 so as to provide the optimal illumination condition that the arithmetic section 174 has calculated. For example, the arithmetic section 174 selects, as described later, an optimal illumination-controlling member as the illumination-controlling member 200 from among multiple illumination-controlling members.

Figure 17:
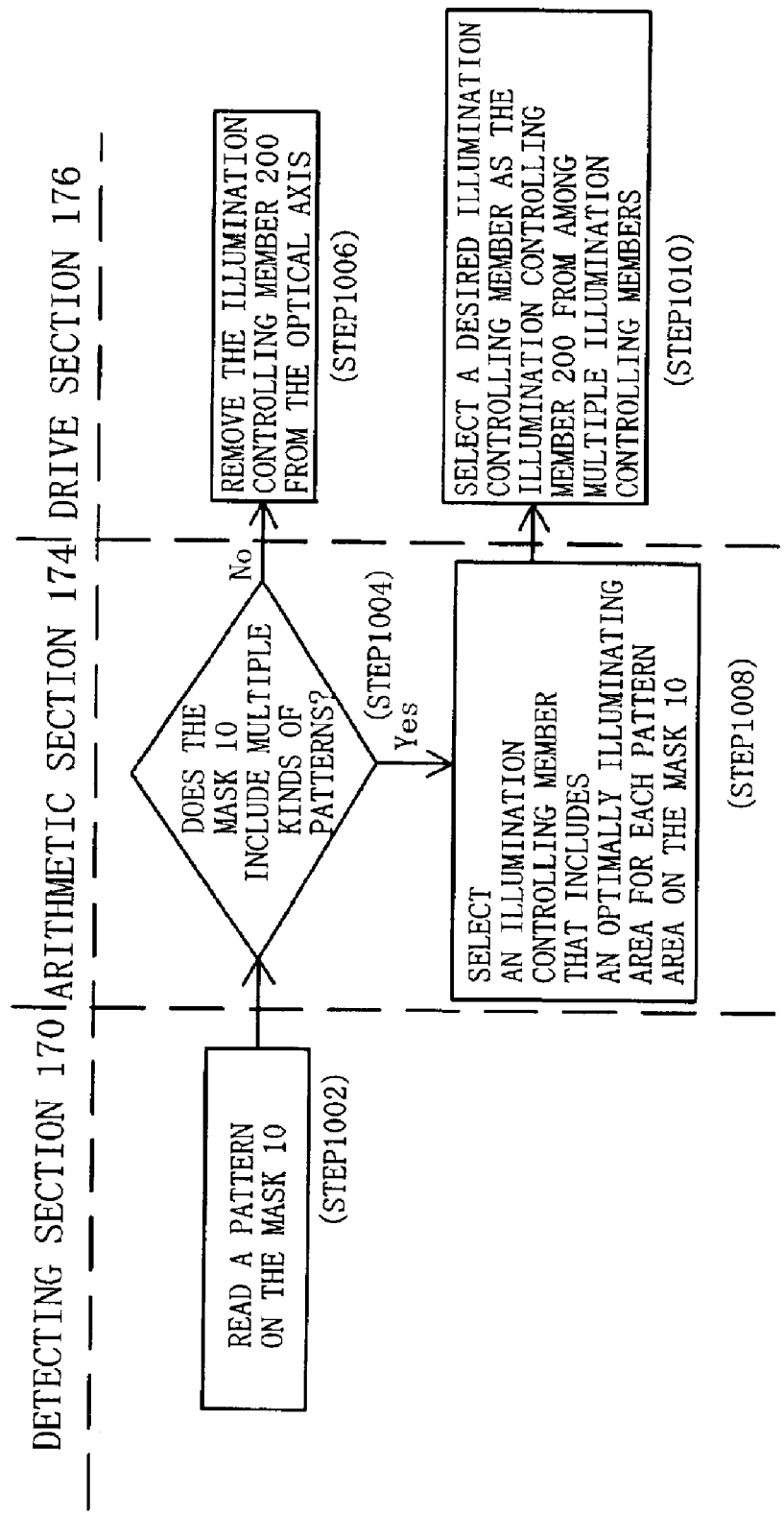
FIG. 17 is a flowchart showing the illumination-controlling method of the present invention.

Referring to FIG. 17, a description will be given below of an example of the illumination-controlling method of the present invention. Multiple illumination-controlling members, in which such various kinds of patterns as illumination-controlling members 200A–200J shown in FIGS. 4–14 are assigned to the areas 242 and 244, are prepared and arranged for selection by the drive section 176. At first, the mask 10 and plate 30 are set in the exposure apparatus 1, and then, the detecting section 172 of the illumination controller 170 reads the pattern on the mask 10 (step 1002). Next, the detection result of the detecting section 172 is sent to the arithmetic section 174, which, in turn, determines whether the mask 10 has multiple kinds of patterns (step 1004). The term "multiple kinds" means those which need different illumination conditions like memory and logic patterns. The arithmetic section 174, when determining that the mask 10 does not have multiple patterns (step 1004), controls the drive section 176 so as to remove the illumination-controlling member 200 from the optical axis (step 1006). The arithmetic section 174, when determining that the mask 10 has multiple patterns (step 1004), selects an illumination-controlling member that has an optimally illuminated area for each pattern area (step 1008). Then, the arithmetic section 174 drives the drive section 176 so as to select a desired illumination-controlling member as the illumination-controlling section 200 from among the multiple illumination-controlling members (step 1010). As a result, an illumination-controlling member 200 best suited to expose the mask 10 is mounted onto the exposure apparatus 1.

The projection optical system 300 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit. A shape of an effective light source formed on the pupil plane 310 of the projection optical system 300 is the same as those shown in FIGS. 3–14.

In exposure, light emitted from the laser 112 is reshaped into a desired beam shape by the beam shaping system 114, and then enters the illumination-controlling member 200 in the illumination optical system 120. The illumination-controlling member 200, which has previously formed the illuminated areas 242 and 244 corresponding to the areas 12 and 14 on the mask 10, creates, at the position approximately conjugate with the mask 10, illumination conditions optimal to the areas 12 and 14. Then, such illumination light is guided into the optical integrator 130 and made uniform. Next, the uniform illumination light passes through the aperture stop 150 and illuminates the areas 12 and 14 on the mask 10 via the condenser lens 160 under optimal illumination conditions.

Beams having passed the mask 10 are projected under a specific magnification onto the plate 30 due to the image-forming operation of the projection optical system 300. The exposure apparatus 1 of a step-and-scan type would fix the light source section 110 and the projection optical system 300, and synchronously scan the mask 10 and plate 30, then exposing the entire shot. The second stage for the plate 30 is stepped to the next shot, thus exposing and transferring a large number of shots on the plate 30. In this way, the patterns 11 and 13 on the mask 10 are transferred to the plate 30. If the exposure apparatus 1 is of a step-and-repeat type, exposure would be performed with the mask 10 and the plate 30 in a stationary state. As a result, the exposure apparatus 1 can perform a pattern transfer to the resist with high precision, thus providing high quality devices (such as semiconductor devices, LCD devices, image pick-up devices (such as CCDs), thin film magnetic heads, and the like).

Figure 18:
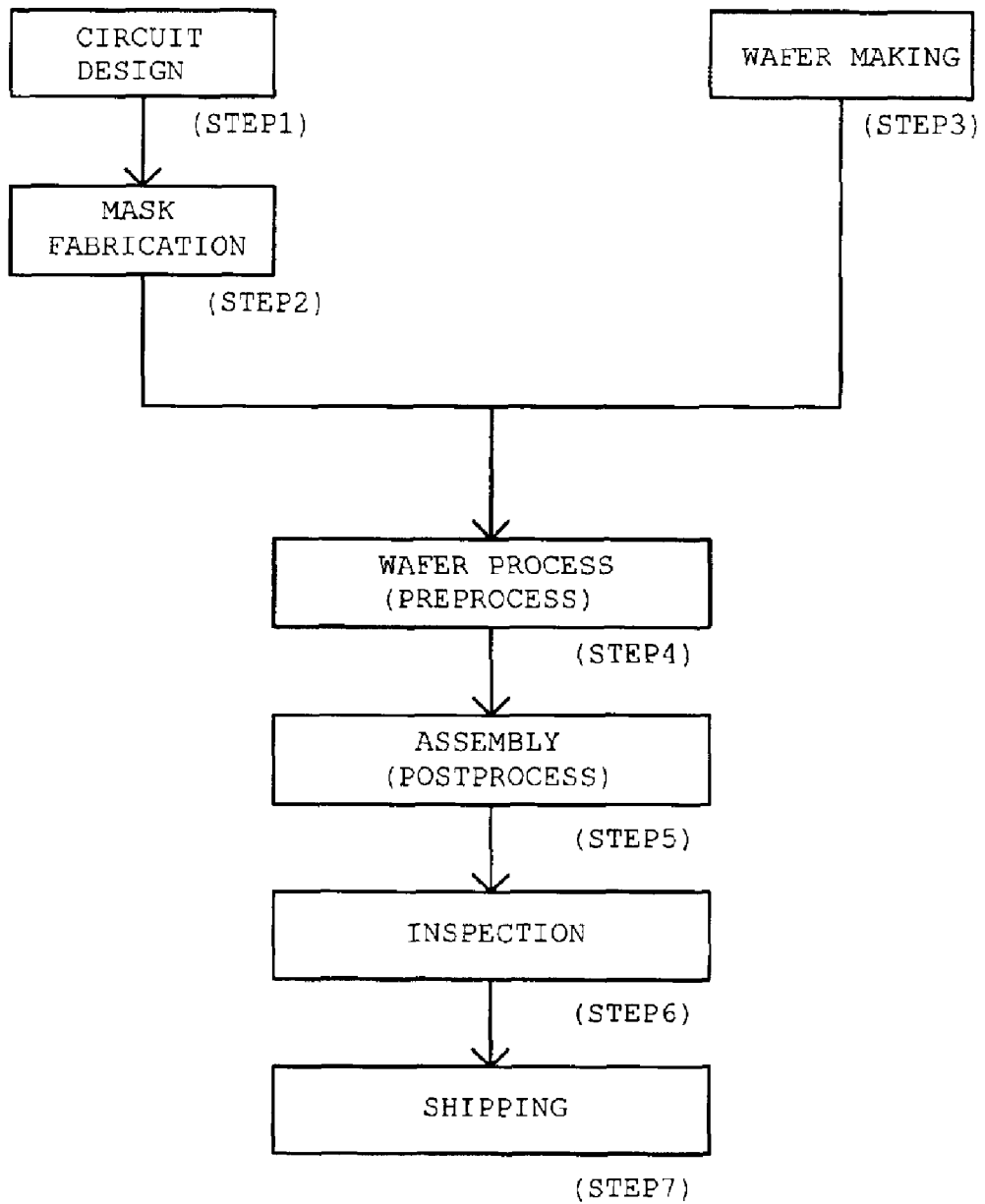
FIG. 18 is a flowchart for explaining a fabrication of devices using the exposure apparatus of the present exposure.
Figure 19:
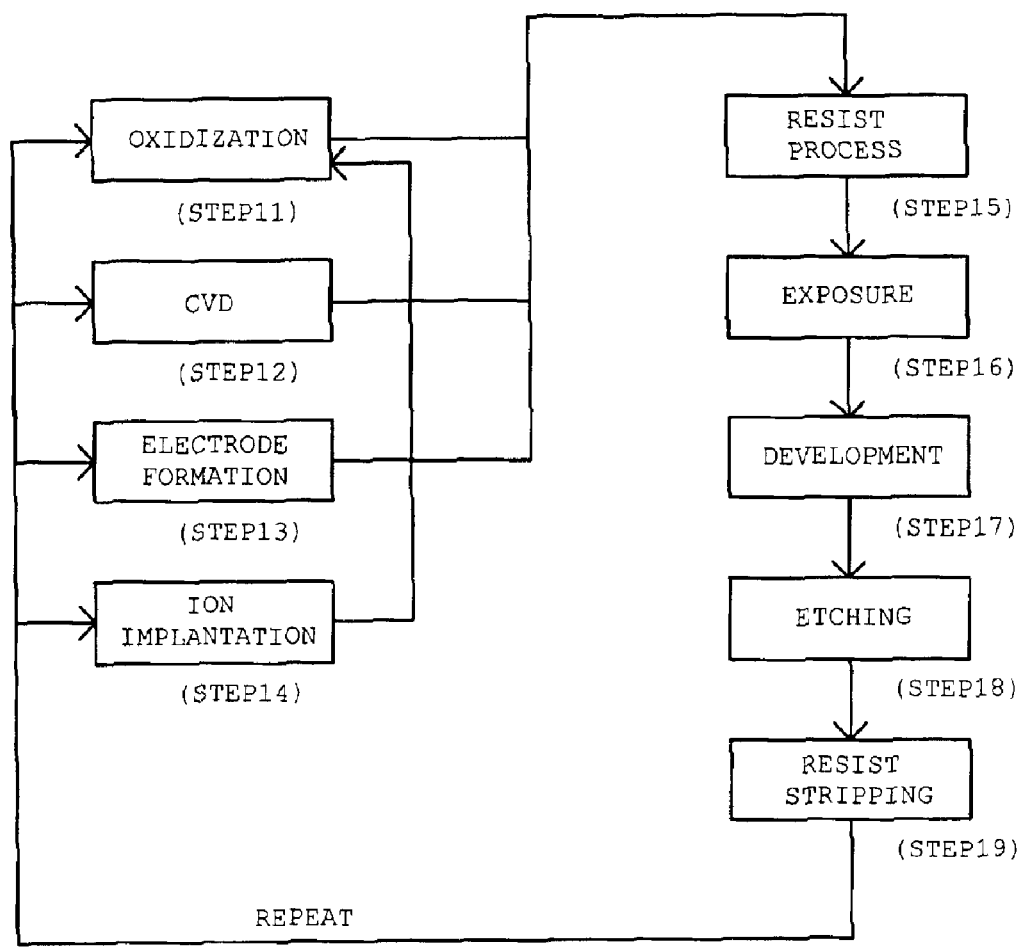
FIG. 19 is a detailed flowchart for Step 4 shown in FIG. 18.

Referring to FIGS. 18 and 19, a description will now be given of an embodiment of a device fabricating method using the above mentioned exposure apparatus 1. FIG. 18 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design)

designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 19 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer.

Further, the present invention is not limited to these preferred embodiments, and various modifications and changes may be made in the present invention without departing from the spirit and scope thereof.

According to the present invention, it is possible to expose a mask with high precision on which multiple kinds of patterns having different optimal illumination conditions are drawn. In addition, a device fabricating method using such apparatuses and methods can fabricate high quality devices.

What is claimed is:

1. An illumination apparatus comprising:
   an optical integrator including multiple optical systems for receiving light from a light source, and for producing multiple beams for illuminating a plane to be illuminated, an incidence plane of each said multiple optical systems and the plane to be illuminated being arranged optically conjugate with each other; and
   a device for forming polarization distribution of light at the incidence plane, the light entering at least part of the multiple optical systems, whereby the different areas on the plane to be illuminated may be illuminated under different polarization conditions.

2. An illumination apparatus according to claim 1, wherein said device comprises a member that includes a polarizing pattern for forming the polarization distribution.

3. An illumination apparatus according to claim 1, wherein the multiple optical systems in said optical integrator each includes a rod type biconvex lens.

4. A projection exposure apparatus comprising:
   an illumination apparatus for illuminating a mask or reticle; and
   a projection optical system for projecting a pattern of the mask or reticle onto an object,
   wherein said illumination apparatus comprising:
   an optical integrator including multiple optical systems for receiving light from a light source, and for producing multiple beams for illuminating the mask or reticle, an incidence plane of each said multiple optical system and the mask or reticle being optically conjugate with each other; and
   a device for forming polarization distribution of light at the incidence plane, the light entering at least part of the multiple optical systems, whereby different areas on the plane of the mask or reticle can be illuminated under different polarization conditions.

5. A projection exposure apparatus according to claim 4, wherein the different areas form a memory pattern and a logic pattern.

6. A device fabricating method comprising the steps of:
   exposing an object using a device pattern and an illumination apparatus comprising an optical integrator including multiple optical systems for receiving light from a light source, and for producing multiple beams for illuminating mask or reticle on which the device pattern is formed, an incidence plane of each said multiple optical system and the mask or reticle being optically conjugate with each other, and a device for forming polarization distribution of light at the incidence plane, the light entering at least part of the multiple optical systems, whereby different areas on the mask or reticle can be illuminated under different polarization conditions; and
   performing a predetermined process for the exposed object.

* * * * *

UNITED STATES PATENT AND TRADEMARK OFFICE
CERTIFICATE OF CORRECTION

PATENT NO. : 6,934,009 B2
DATED : August 23, 2005
INVENTOR(S) : Takaaki Terashi

It is certified that error appears in the above-identified patent and that said Letters Patent is hereby corrected as shown below:

Column 7,
Line 13, change "$0<\sigma<0.5$" to -- $0<\sigma\leq0.5$ --.

Column 10,
Line 3, change "each cell" to -- each cell 240 --.

Signed and Sealed this

Second Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,934,009 B2
DATED : August 23, 2005
INVENTOR(S) : Takaaki Terashi

It is certified that error appears in the above-identified patent and that said Letters Patent is hereby corrected as shown below:

Column 7,
Line 13, change "$0<\sigma<0.5$" to -- $0<\sigma\leq0.5$ --.

Column 10,
Line 3, change "each cell" to -- each cell 240 --.

Signed and Sealed this

Sixth Day of June, 2006

JON W. DUDAS
*Director of the United States Patent and Trademark Office*